United States Patent
Mohata et al.

(10) Patent No.: US 12,027,616 B1
(45) Date of Patent: Jul. 2, 2024

(54) EMBEDDED NON-OVERLAPPING SOURCE FIELD DESIGN FOR IMPROVED GaN HEMT MICROWAVE PERFORMANCE

(71) Applicant: Global Communication Semiconductors, LLC, Torrance, CA (US)

(72) Inventors: Dheeraj Mohata, Bhubaneshwar (IN); Shing-Kuo Wang, Torrance, CA (US); Liping Daniel Hou, Torrance, CA (US)

(73) Assignee: Global Communication Semiconductors, LLC, Torrance, CA (US)

( * ) Notice: Subject to any disclaimer, the term of this patent is extended or adjusted under 35 U.S.C. 154(b) by 113 days.

(21) Appl. No.: 17/166,258

(22) Filed: Feb. 3, 2021

(51) Int. Cl.
| | | |
|---|---|---|
| H01L 29/778 | (2006.01) | |
| H01L 29/20 | (2006.01) | |
| H01L 29/40 | (2006.01) | |
| H01L 29/423 | (2006.01) | |

(52) U.S. Cl.
CPC ...... *H01L 29/7787* (2013.01); *H01L 29/2003* (2013.01); *H01L 29/402* (2013.01); *H01L 29/42372* (2013.01)

(58) Field of Classification Search
CPC ............. H01L 29/7787; H01L 29/2003; H01L 29/402; H01L 29/42372
See application file for complete search history.

(56) References Cited

U.S. PATENT DOCUMENTS

| | | | |
|---|---|---|---|
| 2009/0065810 A1* | 3/2009 | Honea | H01L 27/0605 257/192 |
| 2010/0163936 A1* | 7/2010 | Immorlica | H01L 29/42316 257/284 |
| 2012/0049243 A1 | 3/2012 | Wu | |
| 2013/0341678 A1* | 12/2013 | Green | H01L 21/31111 257/E29.317 |
| 2014/0061659 A1 | 3/2014 | Teplik et al. | |
| 2015/0279722 A1* | 10/2015 | Kikuchi | H01L 29/402 257/192 |
| 2017/0077245 A1* | 3/2017 | Huang | H01L 29/66462 |
| 2021/0111254 A1* | 4/2021 | Jones | H01L 29/7786 |

* cited by examiner

*Primary Examiner* — Mohammed R Alam
(74) *Attorney, Agent, or Firm* — Maiorana Patent Law, PA

(57) ABSTRACT

A device includes a semiconductor die, a source contact, a drain contact, a first passivation layer, a T-shaped gate contact, a field plate, and a second passivation layer. The semiconductor die generally includes a plurality of semiconductor layers disposed on an insulating substrate. The source contact and the drain contact are electrically coupled to a channel formed in the semiconductor layers and defining an active area of the device. The first passivation layer generally covers the active area of the device, the source contact, and the drain contact. The T-shaped gate contact may be disposed within the active area of the device. The T-shaped gate contact is generally electrically separated from the channel and comprises a column portion and a cap portion. The field plate may be disposed above the active area of the device. The field plate is generally adjacent to and laterally separated from the cap portion of the T-shaped gate contact. The second passivation layer generally covers the first passivation layer, the cap portion of the T-shaped gate contact, and the field plate.

20 Claims, 6 Drawing Sheets

EMBEDDED NON-OVERLAPPING SOURCE FIELD DESIGN FOR IMPROVED GaN HEMT MICROWAVE PERFORMANCE

FIELD OF THE INVENTION

The invention relates to semiconductor devices generally and, more particularly, to a method and/or apparatus for implementing an embedded non-overlapping source field design for improved gallium nitride (GaN) high electron mobility transistor (HEMT) microwave performance.

BACKGROUND

Over the last few years, gallium nitride (GaN) has emerged as an excellent platform for fabrication of power semiconductor devices for power switching, power converter, and power amplifier applications. The semiconductor material possesses a high breakdown electric field, 3.3 MV/cm. High breakdown electric field is one of the key properties that enables devices such as High Electron Mobility Transistors (HEMTs) to reach breakdown voltages in excess of 1 kV. Using a built-in polarization property, $Al_xGa_{1-x}N$/GaN heterojunctions can induce two-dimensional electron carrier gas (2-DEG) densities in excess of $1e13/cm^2$, providing increased conductivity while maintaining high breakdown voltages, a limitation in conventional semiconductors such as Si, GaAs, or InP.

AlGaN/GaN HEMTs are typically lateral field effect devices comprising source, drain, and gate contacts. The AlGaN layer typically serves as a barrier layer while the GaN layer serves as the channel. Bias on the gate contact is used to control the 2-DEG density in the channel directly underneath the gate and the barrier layers. The source contact supplies carriers to the 2-DEG channel while the drain contact is used to apply a high lateral electric field to move the charge out of the drain and generate a high drain current.

Due to the ever increasing demands of wireless communication systems, achieving high output power with high power added efficiencies (PAEs) are becoming increasingly important. Because of the excellent electrical properties of the AlGaN/GaN semiconductor material, AlGaN/GaN HEMTs can output much higher power at comparatively higher efficiencies. However, some design aspects need special attention in order to maintain these performance advantages with high quality and an acceptable lifetime.

Because the AlGaN/GaN epi-layer is lattice mis-matched, there is significant strain in the AlGaN barrier layer. In addition, more stress is added to the AlGaN barrier layer by the applied gate and drain electric fields due to the process of inverse piezo-electric effect. The electric field peak tends to concentrate near the drain edge of the gate causing defect generation, which reduces breakdown of the device and impacts performance. Gate connected and source connected field plate techniques are typically used to reduce the peak value of the electric field value and distribute the electric field across the gate and drain access region instead of just concentrating the electric field near the gate-drain edge. However, these field plates can be ineffective or add additional parasitic capacitances if not properly designed, causing significant reduction in gain and high frequency performance.

It would be desirable to implement an embedded non-overlapping source field design for improved gallium nitride (GaN) high electron mobility transistor (HEMT) microwave performance.

SUMMARY

The invention concerns a device comprising a semiconductor die, a source contact, a drain contact, a first passivation layer, a T-shaped gate contact, a field plate, and a second passivation layer. The semiconductor die generally includes a plurality of semiconductor layers disposed on an insulating substrate. The source contact and the drain contact are electrically coupled to a channel formed in the semiconductor layers and defining an active area of the device. The first passivation layer generally covers the active area of the device, the source contact, and the drain contact. The T-shaped gate contact may be disposed within the active area of the device. The T-shaped gate contact is generally electrically separated from the channel and comprises a column portion and a cap portion. The field plate may be disposed above the active area of the device. The field plate is generally adjacent to and laterally separated from the cap portion of the T-shaped gate contact. The second passivation layer generally covers the first passivation layer, the cap portion of the T-shaped gate contact, and the field plate.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing an embedded non-overlapping source field design for improved gallium nitride (GaN) high electron mobility transistor (HEMT) microwave performance that may (i) employ embedded a source connected field plate that does not have any overlap on top or under the gate field plate, (ii) position the source connected field plate within the gate and drain access region, (iii) place a bottom edge of the field plate on top of a first passivation layer instead on top of a second passivation layer, (iv) reduce gate parasitic capacitance, (v) boost gain while reducing the peak electric field near the gate drain edge, (vi) provide improvement in peak electric field similar to an overlapping source field plate, (vii) provide a significant improvement in gain, (viii) provide an improvement of gain tied to a vertical positioning of the bottom edge of the source connected field plate, (ix) provide an improvement in gain both at low and high frequencies for the same device with modified source connected field plate design, and/or (x) be implemented as one or more monolithic microwave integrated circuits (MMICs).

The present application relates generally to semiconductor devices and circuits for use in microwave frequency applications. The present application relates specifically to Nitride based semiconductor devices such as Gallium Nitride (GaN) based heterojunction High Electron Mobility Transistors (HEMTs) and related Monolithic Microwave Integrated Circuits (MMICs) fabricated on lattice matched GaN substrates or lattice mis-matched Silicon Carbide, Sapphire, Silicon, Diamond or other substrates using processes and materials compatible with Silicon and compound semiconductor manufacturing processing lines.

In various embodiments, structures are provided for transistors, such as high electron mobility transistors (HEMTs) that provide lower gate-to-source and gate-drain capacitances, as well as high gate resistance. This results in devices having increased device gain, bandwidth, and operational frequencies. In various embodiments, the transistors generally have a "T-shaped" gate with a field plate disposed laterally from one or both overhangs of a cap portion of the T-shaped gate.

The arrangement in accordance with embodiments of the invention may be used with many different transistor structures, such as transistor structures made of wide bandgap materials. Transistors generally include an active region having a plurality of semiconductor layers, one of which is a channel layer. The channel layer is often made of a two-dimensional electron carrier gas (2-DEG). Metal source and drain electrodes are generally formed in contact with the active region, and a gate is formed on the active region between the source and drain electrodes for modulating electric fields within the active region.

Figure 1:
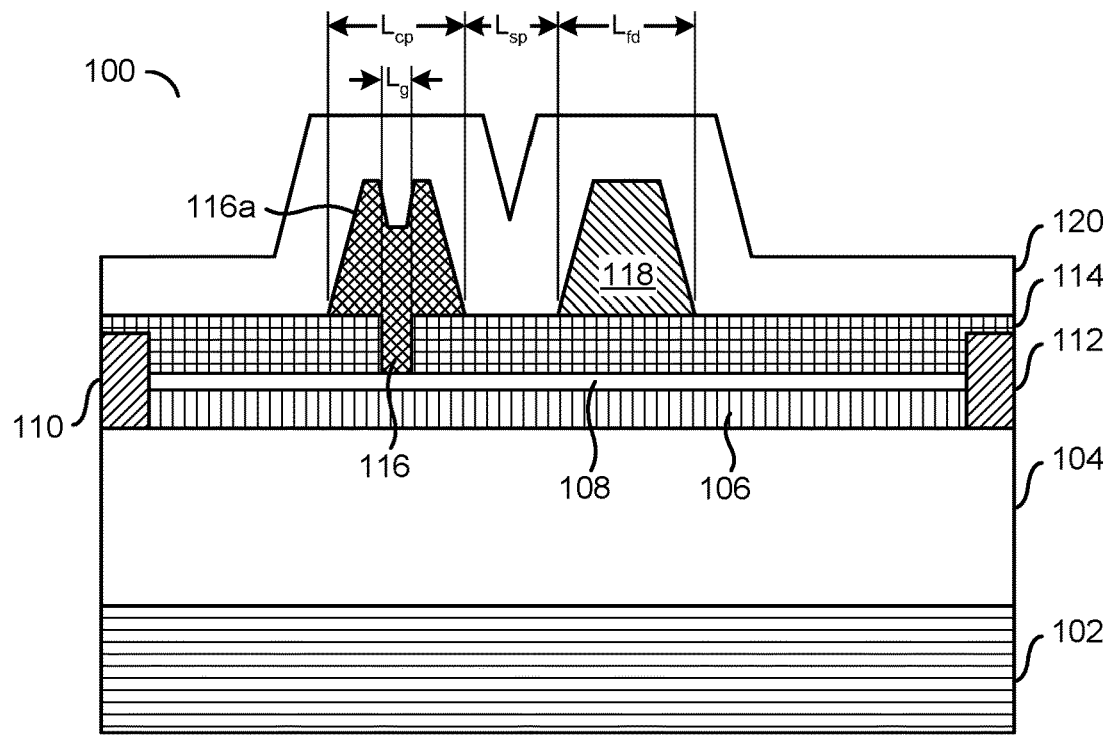
FIG. 1 is a sectional view of a HEMT in accordance with an example embodiment of the invention.

Referring to FIG. 1, a sectional view of a HEMT 100 in accordance with an example embodiment of the invention is shown. In various embodiments, the HEMT 100 may be Group-III nitride based, although other material systems may also be used. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In various embodiments, the HEMT 100 may comprise a substrate 102, a channel and buffer (or simply channel) layer 104, a barrier layer 106, a cap layer 108, a source electrode 110, a drain electrode 112, a first passivation layer 114, a gate electrode 116, a field plate 118, and a second passivation layer 120. The substrate 102 may be made from silicon carbide, sapphire, spinel, ZnO, silicon, gallium nitride, aluminum nitride, or any other material or combinations of materials capable of supporting growth of a Group-III nitride material.

In embodiments where the substrate 102 comprises silicon carbide, the substrate 102 may be made of a 4H polytype of silicon carbide, although other silicon carbide polytypes may also be used, including 3C, 6H, and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible.

In various embodiments, the channel and buffer layer 104 may comprise a high resistivity buffer layer formed on the substrate layer 102. In an example, the channel and buffer layer 104 may comprise doped or undoped layers of Group III-nitride materials. In one example, the channel and buffer layer 104 may be formed with GaN that is approximately 0.5-2.0 µm thick, with part of the buffer layer doped with Fe. In another example, the channel and buffer layer 104 may be formed of another Group III-nitride material such as $Al_xGa_yIn_{(1-x-y)}N$ ($0<=x<=1$, $0<=y<=1$, $x+y<=1$). However, other materials may also be used for the channel and buffer layer 104.

In some embodiments, an optional nucleation layer (not shown) may be formed on the substrate 102 to reduce a lattice mismatch between the substrate 102 and the channel and buffer layer 104. In an example, the nucleation layer may be approximately 1000 angstroms (Å) thick. However, other thicknesses may be used to meet design criteria of a particular application. In an example, the nucleation layer may comprise many different materials, with a suitable material being $Al_zGa_{1-z}N$ ($0<=z<=1$). The nucleation layer may be formed on the substrate 102 using known semiconductor growth techniques such as Metal Organic Chemical Vapor Deposition (MOCVD), Hydride Vapor Phase Epitaxy (HYPE), or Molecular Beam Epitaxy (MBE).

The formation of a nucleation layer may depend on the material used for the substrate 102. For example, methods of forming a nucleation layer on various substrates may be found in U.S. Pat. No. 5,290,393 to Nakamura and U.S. Pat. No. 5,686,738 to Moustakas, each of which are incorporated by reference as if fully set forth herein. Methods of forming nucleation layers on silicon carbide substrates may be found in U.S. Pat. No. 5,393,993 to Edmond et al., U.S. Pat. No. 5,523,589 to Edmond et al., and U.S. Pat. No. 5,739,554 to Edmond et al., each of which is incorporated herein by reference as if fully set forth herein.

The barrier layer 106 is generally formed on the channel and buffer layer 104, with the channel and buffer layer 104 being sandwiched between the barrier layer 106 and the substrate 102. Similar to the channel and buffer layer 104, the barrier layer 106 may comprise doped or undoped layers of Group III-nitride materials. In an example, the barrier layer 106 may be made of one or multiple layers of $Al_xGa_{1-x}N$ or $Al_xIn_yGa_{1-x-y}N$, where x ranges from 0-1, and x can be a function of depth such that the barrier layer 106 may be a graded layer. A 2-DEG channel layer is generally induced at the heterointerface between the channel and buffer layer 104 and the barrier layer 106, with the channel and buffer layer 104, 2DEG channel layer, and the barrier layer 106 generally forming an active region of the HEMT 100.

The cap layer 108 may be formed on the barrier layer 106, with barrier layer 108 being sandwiched between the cap layer 108 and the channel and buffer layer 104. In an example, the cap layer 108 may comprise doped or undoped layers of Group III-nitride materials. In one example, the cap layer 108 may be formed with GaN. In an example, a thickness of the semiconductor cap layer 108 may range from about 1 nm and to about 10 nm.

In various embodiments, a metal source electrode 110 and a metal drain electrode 112 may be formed on the channel and buffer layer 104 and in contact with the barrier layer 106 and the cap layer 108. The T-shaped gate electrode 116 may be formed on the cap layer 108 through an opening in the first passivation layer 114. The T-shaped gate electrode 116 is generally formed between the source electrode 110 and the drain electrode 112. Electric current may flow between the source electrode 110 and the drain electrode 112 through the 2-DEG channel layer induced between the channel and buffer layer 104 and the barrier layer 106 when the T-shaped gate electrode 116 is biased at an appropriate level.

The source electrode 110 and the drain electrode 112 may be made of different materials including, but not limited to, alloys of titanium, aluminum, gold or nickel. The gate electrode 116 may also be made of different materials including, but not limited to, gold, nickel, platinum, titanium, chromium, alloys of titanium and tungsten, and/or platinum silicide. The gate electrode 116 may have many different lengths ($L_g$), with a suitable gate length ranging from 10 nm to 1000 nm. However, other gate lengths may also be used to meet design criteria of a particular application.

The first passivation layer 114 is generally formed on the cap layer 108 between the gate electrode 116 and the source electrode 110, and between the gate electrode 116 and the drain electrode 112. The first passivation layer 114 generally covers all of the cap layer 108 between the gate electrode 116, the source electrode 110, and the drain electrode 112. The first passivation layer 114 may comprise a dielectric layer, or a combination of multiple dielectric layers. In an example, the first passivation layer 114 may be a dielectric film with a single uniform composition, a film with continuously varying composition, or a multilayer film of different compositions. In various embodiments, different inorganic dielectric materials may be used such as a SiN, $SiO_2$, Si, Ge, $MgO_x$, $MgN_x$, ZnO, $SiN_x$, $SiO_x$, alloys or layer sequences thereof. The first passivation layer 114 may be many different thicknesses, with a suitable range of thicknesses being approximately 50 nm to 500 nm.

The T-shaped gate electrode 116 also comprises a cap portion 116a, which is larger than and integral to the gate electrode 116. The larger cap portion 116a overhangs and has a larger cross-section than the gate electrode 116. As a result, the larger cap portion 116a has lower resistance and enhanced gate conductance. The cap portion 116a and the gate electrode 116 are generally T-shaped, but it is understood that these can comprise many different shapes. The objective is to include a section on the gate electrode 116 to improve conductivity to allow for higher frequency operation, with the cap section 116a being enlarged to achieve this objective. Having a particular shape to the enlarged cap portion 116a is not critical.

The cap portion 116a may also be made from a variety of materials, some of which can be the same or similar to the material for the gate electrode 116 above. The overhangs of the cap portion 116a may have many different lengths ($L_{cp}$), with a suitable length ranging from 0.2 um to 2 um, although other lengths may also be used. Additionally, the cap portion 116a may be either on, above, or embedded in the first passivation layer 114. The cap portion 116a and the gate electrode 116 may be fabricated using known photo-resist techniques, and in one embodiment a photo-resist layer may be included on the first passivation layer 114 and the cap portion 116a formed on the photo-resist layer. Subsequent removal of the photo-resist layer may leave a space between the first passivation layer 114 and the cap portion 116a.

The second passivation layer 120 may be formed on the surface of the first passivation layer 114 between the gate electrode 116, the source electrode 110, and the drain electrode 112, and above at least part of the field plate 118. As shown in FIG. 1, the second passivation layer 120 covers all of the first passivation layer 114 between the gate 116, the source electrode 110, and the drain electrode 112. The second passivation layer 120 may comprise a dielectric layer, or a combination of multiple dielectric layers. In various embodiments, different inorganic dielectric materials may be used such as SiN, $SiO_2$, Si, Ge, $MgO_x$, $MgN_x$, ZnO, $SiN_x$, $SiO_x$, alloys or layer sequences thereof. The second passivation layer 120 may alternately be comprised of organic dielectric layers such as benzocyclobutene (BCB) or polyimide. The second passivation layer 120 may be many different thicknesses, with a suitable range of thicknesses being approximately 50 nm to 500 nm.

The field plate 118 may be formed on the first passivation layer 114 laterally displaced a distance $L_{sp}$ from the overhangs of the gate cap portion 116a. In various embodiments, the distance $L_{sp}$ between the gate cap 116a and the field plate 118 may range between about 0.1 μm and about 1 μm. The maximum spacing between the gate cap 116a and the field plate 118 may be dictated by the gate to drain spacing. The field plate 118 may extend on the first passivation layer 114 a distance (or width) $L_{fd}$ toward the drain electrode 112 (e.g., as illustrated in FIG. 1). The first passivation layer 114 typically passivates the semiconductor surface. The first passivation layer 114 may also act as a mechanical support to the gate cap 116a. In an example embodiment, the first passivation layer 114 prevents the field plate 118 from shorting the semiconductor. In various embodiments, the distance $L_{fd}$ may be varied, with a suitable range of distances being from 0.05-0.5 μm. The second passivation layer 120 may also cover the field plate 118.

The field plate 118 may comprise many different conductive materials with a suitable material being a metal or a stack of metal layers deposited using standard metallization techniques. In one embodiment, the field plate 118 may comprise the same metal as the feature the field plate 118 is electrically connected to. In various embodiments, the field plate 118 may be electrically connected to the source electrode 110.

Figure 2:
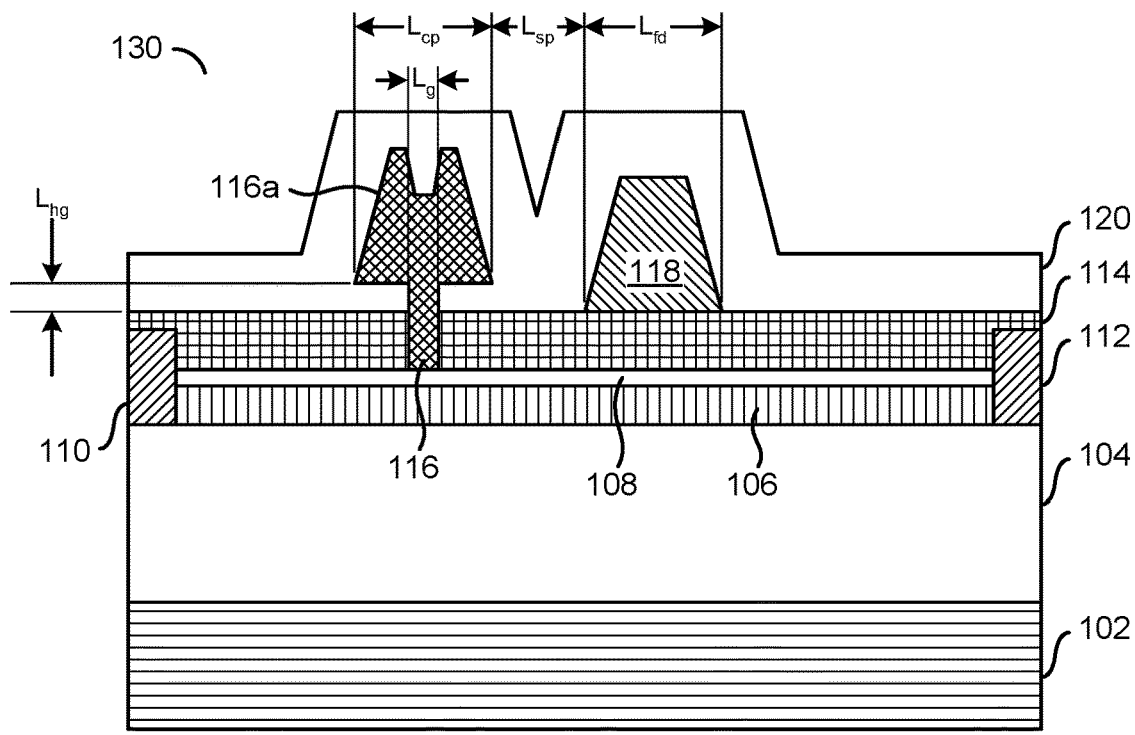
FIG. 2 is a sectional view of a HEMT in accordance with another example embodiment of the invention.

Referring to FIG. 2, a sectional view of a HEMT 130 in accordance with an example embodiment of the invention is shown. The HEMT 130 is similar to the HEMT 100 of FIG. 1, having many features that are similar to those in the HEMT 100, and for those similar features the same reference numbers are used in describing this figure and those below. The HEMT 130 generally depicts a bottom surface of the field plate 118 being on the first passivation layer 114 and a bottom surface of the cap portion 116a of the T-shaped gate contact 116 being separated a distance $L_{hg}$ from the first passivation layer 114 by a portion of the second passivation layer 120. In various embodiments, the separation distance $L_{hg}$ between the bottom surface of the cap portion 116a of the T-shaped gate contact 116 and the first passivation layer 114 may range between 50 nm and 500 nm. The second passivation layer 120 may also be formed over the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 3:
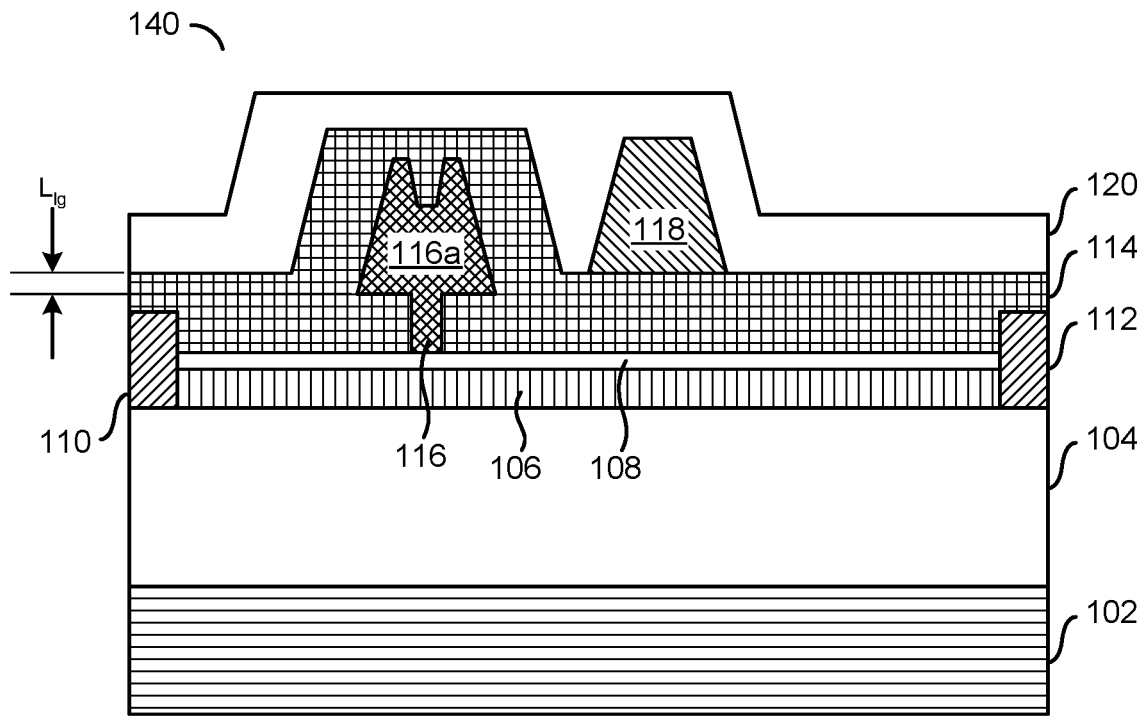
FIG. 3 is a sectional view of a HEMT in accordance with another example embodiment of the invention.

Referring to FIG. 3, a sectional view of a HEMT 140 in accordance with another example embodiment of the invention is shown. The HEMT 140 is similar to the HEMT 100 of FIG. 1, having many features that are similar to those in the HEMT 100, and for those similar features the same reference numbers are used in describing this figure and those below. The HEMT 140 depicts a bottom surface of the field plate 118 being on the first passivation layer 114 and the T-shaped gate contact 116 embedded in the first passivation layer with a bottom surface of the cap portion 116a of the T-shaped gate contact 116 being a distance $L_{lg}$ lower than a bottom surface of the field plate 118, which is on the first passivation layer 114. The second passivation layer 120 may also be formed over the first passivation layer 114 encompassing the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 4:
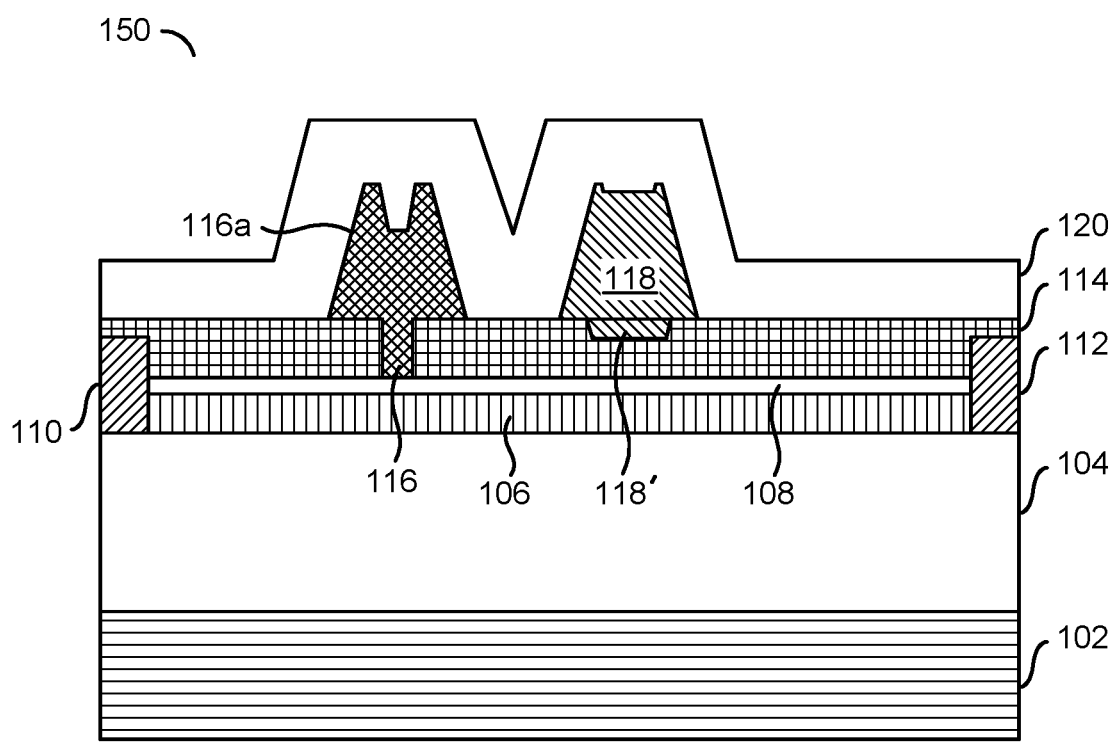
FIG. 4 is a sectional view of a HEMT in accordance with another example embodiment of the invention.

Referring to FIG. 4, a sectional view of a HEMT 150 in accordance with an example embodiment of the invention is shown. The HEMT 150 is similar to the HEMT 100 of FIG. 1, having many features that are similar to those in the HEMT 100, and for those similar features the same reference numbers are used in describing this figure and those below. The HEMT 150 depicts a bottom surface of the field plate 118 being partially on the first passivation layer 114 and partially embedded within the first passivation layer 114. A bottom surface of the cap portion 116a of the T-shaped gate contact 116 is also on the first passivation layer 114, resulting in an embedded portion 118' of the field plate 118 being lower than the bottom surface of the cap portion 116a of the T-shaped gate contact 116.

In various embodiments, the embedded portion 118' of the field plate 118 may have a thickness (height) up to the full thickness of the first passivation layer 114. In one example, the embedded portion 118' may extend downward to a midpoint of the column portion of the T-shaped gate contact 116 embedded in the first passivation layer 114. In another example, the embedded portion 118' may extend downward to the cap layer 108. Although the bottom surface of the field plate 118 is illustrated being partially on the first passivation layer 114 and partially embedded within the first passivation layer 114, in various embodiments a lateral extent (or width) of the embedded portion 118' may be smaller than (as illustrated in FIG. 4), equal to, or greater than the width (e.g., distance $L_{fd}$) of the portion of the field plate 118 above the first passivation layer 114.

Figure 6:
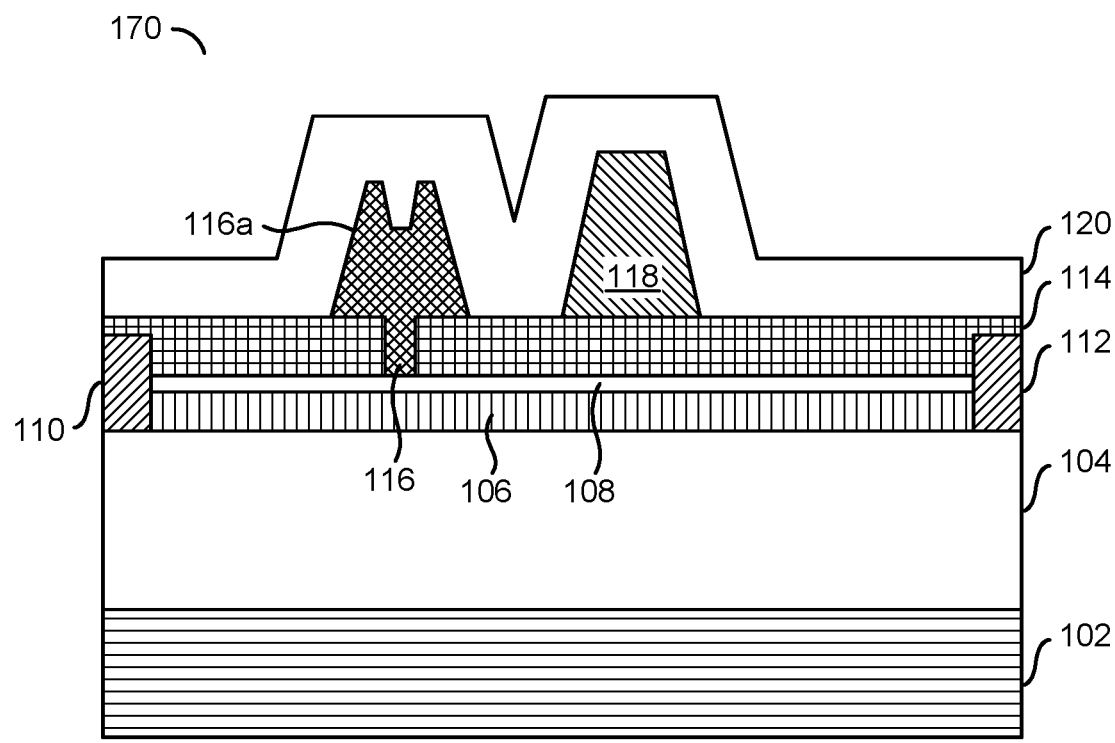
FIG. 6 is a sectional view of a HEMT in accordance with another example embodiment of the invention.

In various embodiments, a height of the portion of the field plate 118 above the top of the first passivation layer 114 may range from being greater than a height of the cap portion 116a of the T-shaped gate electrode 116 (as illustrated in FIG. 6) to essentially zero leaving only the embedded portion 118' within the recess in the first passivation layer 114. The second passivation layer 120 may be formed over the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 5:
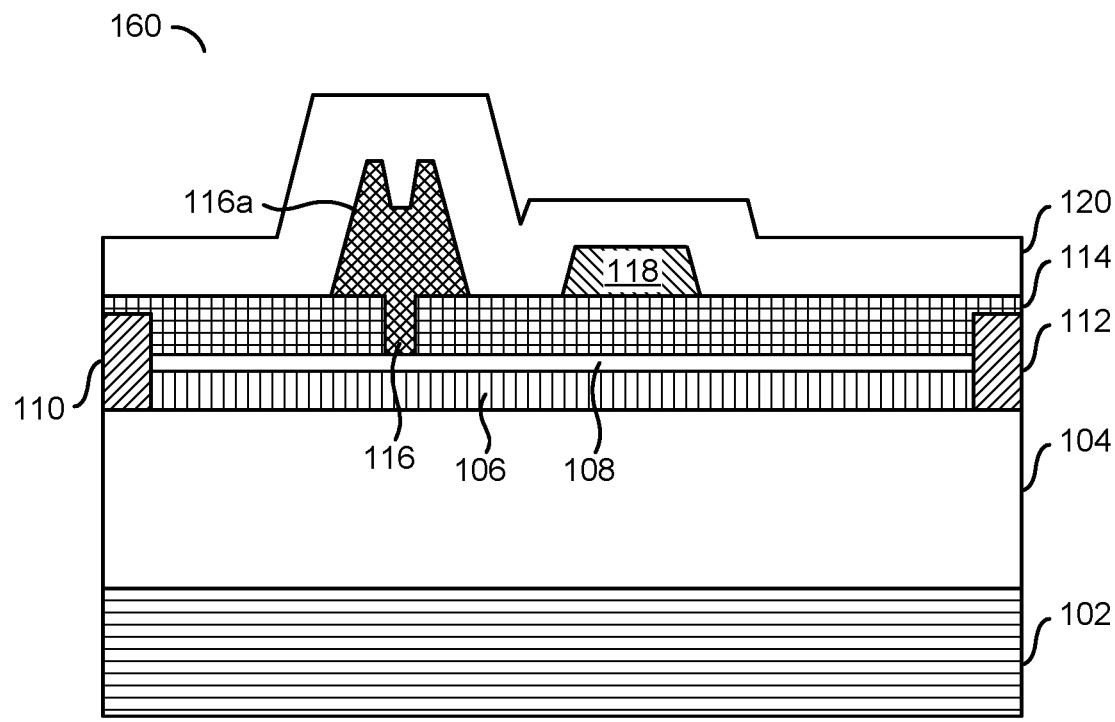
FIG. 5 is a sectional view of a HEMT in accordance with another example embodiment of the invention.

Referring to FIG. 5, a sectional view of a HEMT 160 in accordance with an example embodiment of the invention is shown. The HEMT 160 is similar to the HEMT 100 of FIG. 1, having many features that are similar to those in the HEMT 100, and for those similar features the same reference numbers are used in describing this figure and those below. The HEMT 160 depicts a bottom surface of the cap portion 116a of the T-shaped gate contact 116 and a bottom surface of the field plate 118 being on the first passivation layer 114. In some embodiments, the total metal stack thickness of the field plate 118 may be smaller than the total metal stack thickness of the cap portion 116a of the T-shaped gate contact 116. The second passivation layer 120 may also be formed over the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Referring to FIG. 6, a sectional view of a HEMT 170 in accordance with an example embodiment of the invention is shown. The HEMT 170 is similar to the HEMT 100 of FIG. 1, having many features that are similar to those in the HEMT 100, and for those similar features the same reference numbers are used in describing this figure and those below. The HEMT 170 depicts a bottom surface of the cap portion 116a of the T-shaped gate contact 116 and a bottom surface of the field plate 118 being on the first passivation layer 114. In some embodiments, the total metal stack thickness of the field plate 118 may be greater than the total metal stack thickness of the cap portion 116a of the T-shaped gate contact 116. The second passivation layer 120 may also be formed over the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 7:
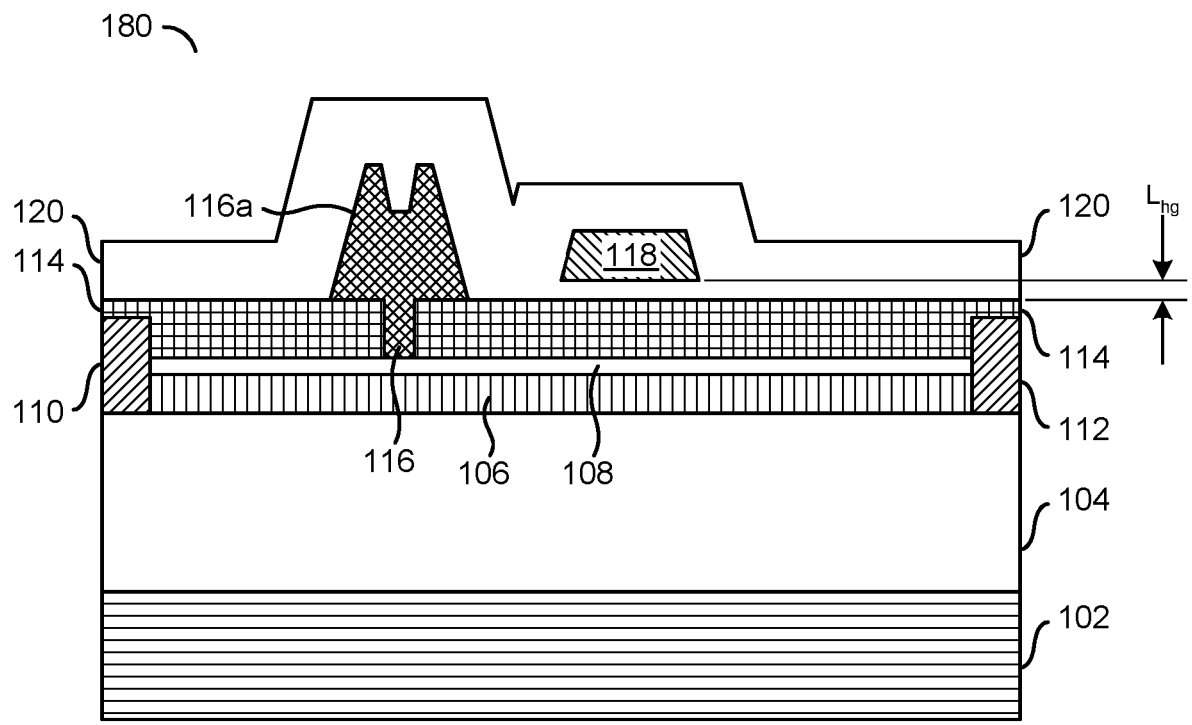
FIG. 7 is a sectional view of a HEMT in accordance with another example embodiment of the invention.

Referring to FIG. 7, a sectional view of a HEMT 180 in accordance with an example embodiment of the invention is shown. The HEMT 180 is similar to the HEMT 100 of FIG. 1, having many features that are similar to those in the HEMT 100, and for those similar features the same reference numbers are used in describing this figure and those below. The HEMT 180 depicts a bottom surface of the cap portion 116a of the T-shaped gate contact 116 being on the first passivation layer 114 and a bottom surface of the field plate 118 being separated a distance $L_{hp}$ from the first passivation layer 114 by a portion of the second passivation layer 120. In various embodiments, the thickness (e.g., distance $L_{hp}$) of the portion of the second passivation layer 120 between the bottom surface of the field plate 118 and the first passivation layer 114 may be up to half the thickness of the second passivation layer 120. In some embodiments, the total metal stack thickness of the field plate 118 may be smaller than the total metal stack thickness of the cap portion 116a of the T-shaped gate contact 116. The second passivation layer 120 may also be formed over the cap portion 116a of the T-shaped gate contact 116, over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 8:
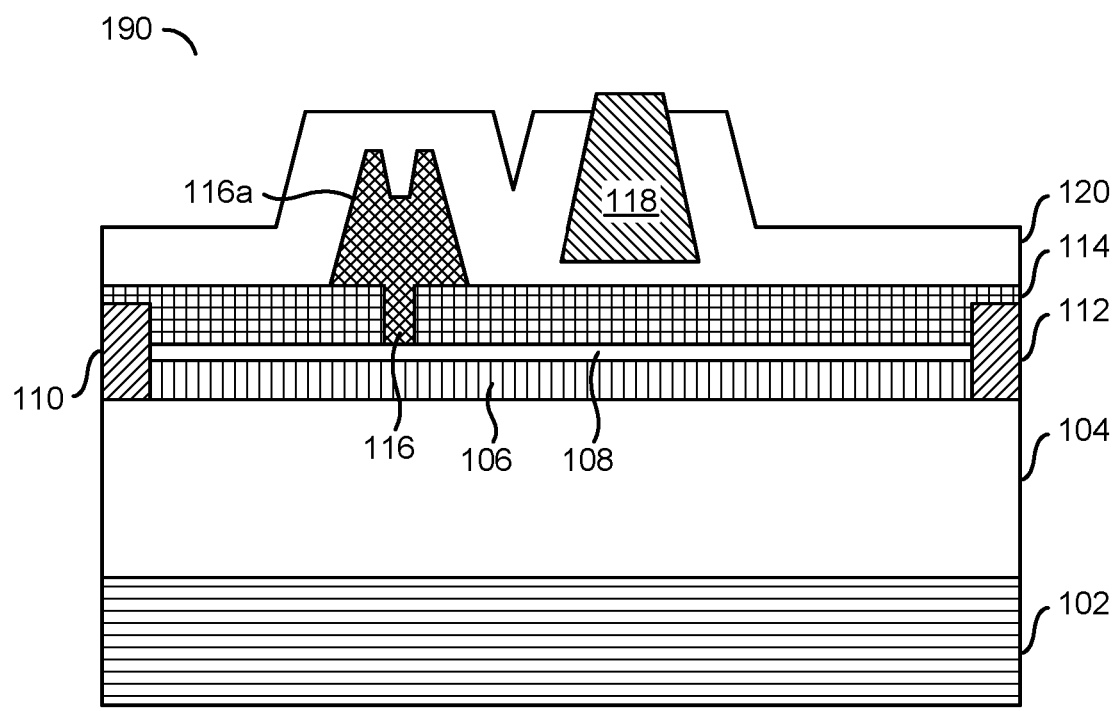
FIG. 8 is a sectional view of a HEMT in accordance with another example embodiment of the invention.

Referring to FIG. 8, a sectional view of a HEMT 190 in accordance with an example embodiment of the invention is shown. The HEMT 190 is similar to the HEMT 100 of FIG. 1, having many features that are similar to those in the HEMT 100, and for those similar features the same reference numbers are used in describing this figure and those below. The HEMT 190 depicts a bottom surface of the cap portion 116a of the T-shaped gate contact 116 being on the first passivation layer 114 and a bottom surface of the field plate 118 being separated by the distance $L_{hp}$ from the first passivation layer 114 by a portion of the second passivation layer 120. In some embodiments, the total metal stack thickness of the field plate 118 may be greater than the total metal stack thickness of the cap portion 116a of the T-shaped gate contact 116. The second passivation layer 120 may also be formed over the cap portion 116a of the T-shaped gate contact 116, partially over the field plate 118, over the first passivation layer 114 between the gate electrode 116 and the source electrode 110, over the first passivation layer 114 between the gate electrode 116 and the field plate 118, and over the first passivation layer 114 between the field plate 118 and the drain electrode 112.

Figure 9:
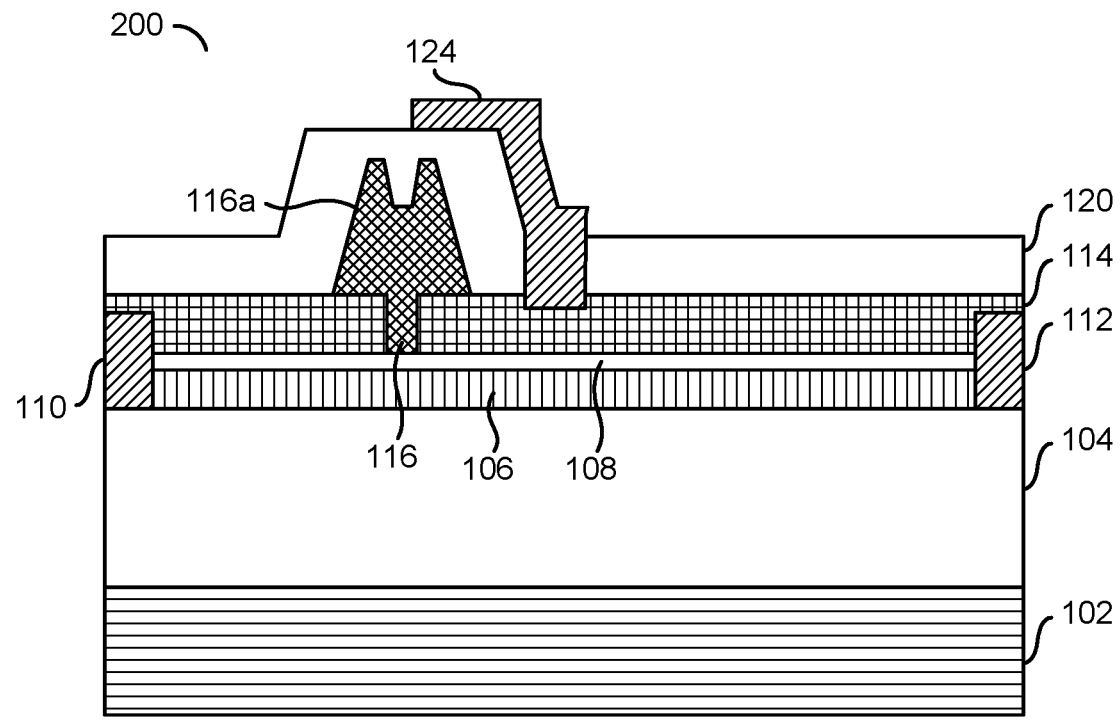
FIG. 9 is a sectional view of a HEMT in accordance with another example embodiment of the invention.

Referring to FIG. 9, a sectional view of a HEMT 200 in accordance with an example embodiment of the invention is shown. The HEMT 200 is similar to the HEMT 100 of FIG. 1, having many features that are similar to those in the HEMT 100, and for those similar features the same reference numbers are used in describing this figure and those below. The HEMT 200 depicts a field plate 124 having a first portion that overlaps the T-shaped gate contact 116 and a second portion that provides a bottom edge that is formed using a recess etch into the second passivation layer 120 and the first passivation layer 114, without employing an etch stop layer. The recess etched into the first passivation layer 114 results in the bottom edge of the second portion of the field plate 124 being lower (closer to the epi-layers of the active region of the HEMT 200) than a bottom surface of the cap portion 116a of the T-shaped gate electrode 116. The second passivation layer 120 is formed over the cap portion 116a of the T-shaped gate contact 116 and over the first passivation layer 114 between the field plate 124 and the drain electrode 112. The first portion of the field plate 124 is formed on the portion of the second passivation layer 120 covering the T-shaped gate contact 116.

Figure 10:
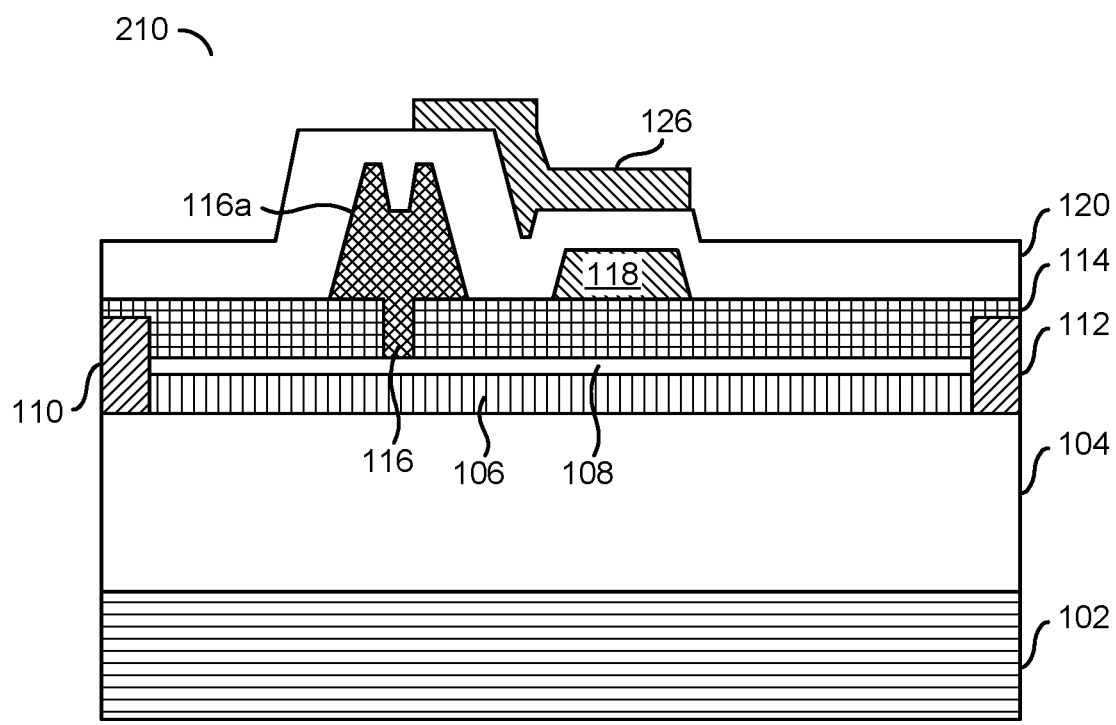
FIG. 10 is a sectional view of a HEMT in accordance with another example embodiment of the invention.

Referring to FIG. 10, a sectional view of a HEMT 210 in accordance with an example embodiment of the invention is shown. The HEMT 210 is similar to the HEMT 160 of FIG. 5 and the HEMT 200 of FIG. 9, having many features that are similar to those in the HEMT 100 and the HEMT 200, and for those similar features the same reference numbers are used in describing this figure and those below. In various embodiments, the HEMT 210 differs from the HEMT 160 and the HEMT 200 in that the HEMT 210 has two field plates. In various embodiments, a first field plate of the HEMT 210 may be implemented using the field plate 118 (described above in connection with FIGS. 1-8). A second field plate 126 of the HEMT 210 may be implemented similarly to the field plate 124 of the HEMT 200 (described above in connection with FIG. 9).

The HEMT 210 depicts a bottom surface of the cap portion 116a of the T-shaped gate contact 116 and a bottom surface of the first field plate 118 being on the first passivation layer 114. In some embodiments, the total metal stack thickness of the first field plate 118 may be smaller than the total metal stack thickness of the cap portion 116a of the T-shaped gate contact 116. The second passivation layer 120 may be formed over the cap portion 116a of the T-shaped gate contact 116, over the first field plate 118, over the first passivation layer 114 between the gate electrode 116 and the source electrode 110, over the first passivation layer 114 between the gate electrode 116 and the first field plate 118, and over the first passivation layer 114 between the first field plate 118 and the drain electrode 112. The second field plate 126 may be formed on a portion of the second passivation layer 120 covering the cap portion 116a of the T-shaped gate contact 116 and the first field plate 118. In an example, the second field plate 126 may be disposed on top of the second passivation layer 120 above the first field plate 118 and extend laterally toward the source electrode 110 such that the second field plate 126 is separated from the first field plate 118 by the second passivation layer 120 and may overlap a portion of the cap portion 116a of the T-shaped gate contact 116. In various embodiments, the first field plate 118 and the second field plate 126 may be source connected field plates.

Figure 11:
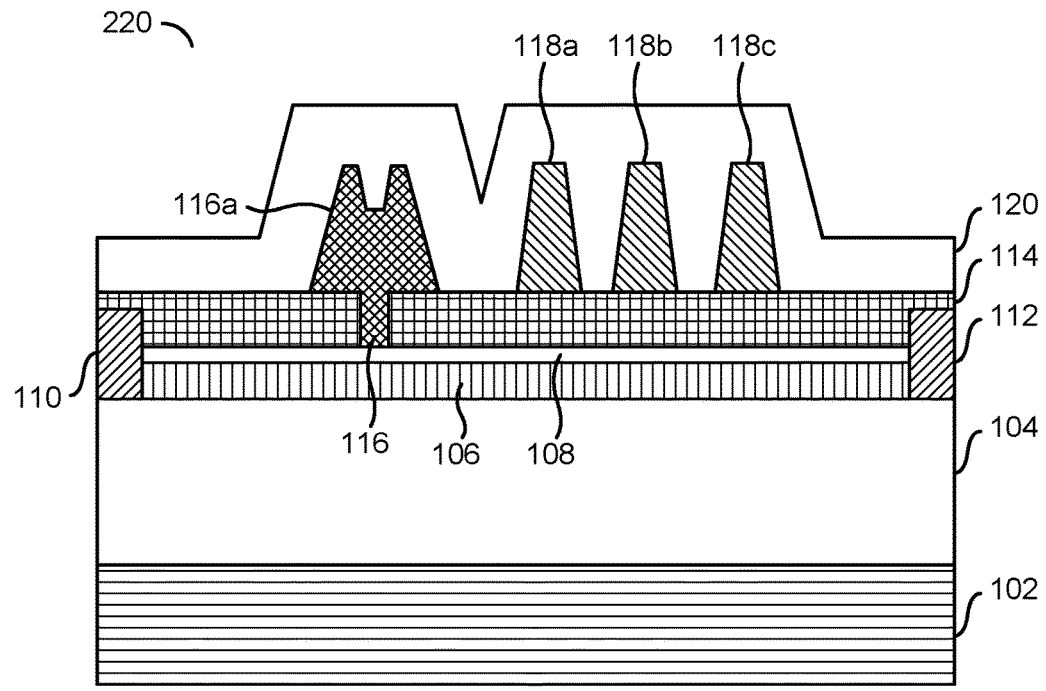
FIG. 11 is a sectional view of a HEMT in accordance with another example embodiment of the invention.

Referring to FIG. 11, a sectional view of a HEMT 220 in accordance with an example embodiment of the invention is shown. The HEMT 220 is similar to the HEMT 100 of FIG. 1, having many features that are similar to those in the HEMT 100, and for those similar features the same reference numbers are used in describing this figure and those below. The HEMT 220 depicts a field plate comprising a plurality of fingers 118a-118c instead of a single finger. A bottom surface of the cap portion 116a of the T-shaped gate contact 116 and a bottom surface of the field plate fingers 118a-118c are generally on the first passivation layer 114. The total metal stack thickness of the field plate fingers 118a-118c are equivalent to the thickness of the total metal stack of the cap portion 116a of the T-shaped gate contact 116. The second passivation layer 120 is also formed over the cap portion 116a of the T-shaped gate contact 116, over the field plate fingers 118a-118c, over the first passivation layer 114 between the gate electrode 116 and the source electrode 110, over the first passivation layer 114 between the gate electrode 116 and the field plate finger 118a, over the first passivation layer 114 between the field plate fingers 118a-118c, and over the first passivation layer 114 between the field plate finger 118c and the drain electrode 112.

Figure 12:
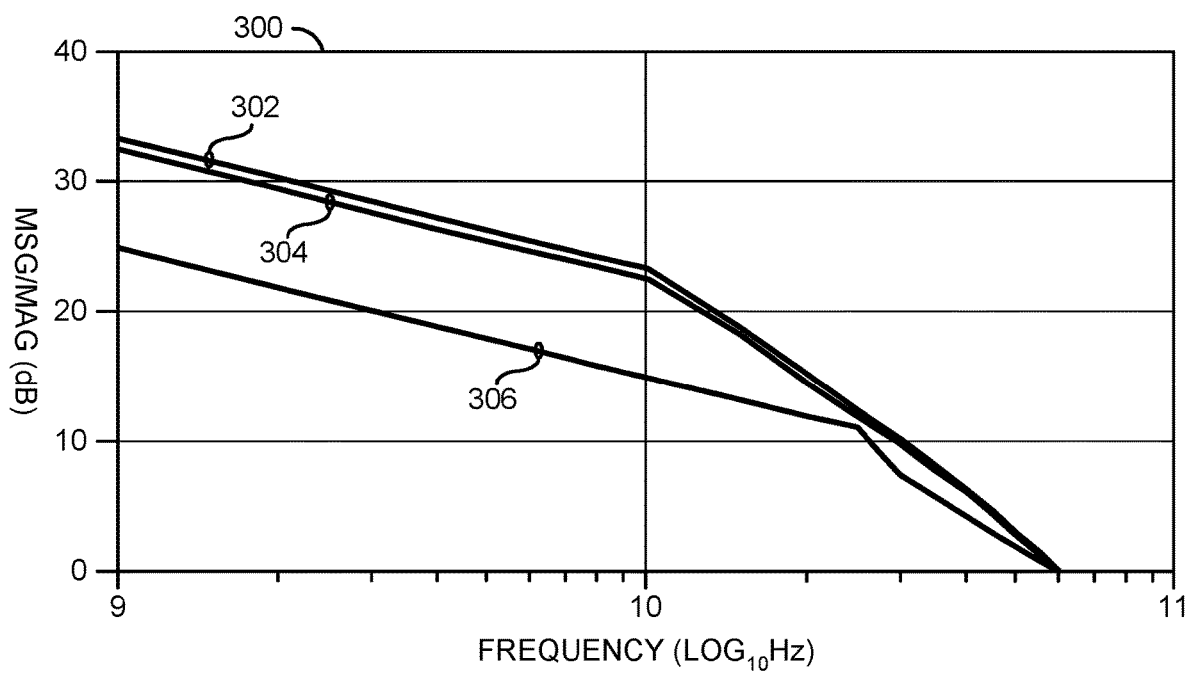
FIG. 12 is a graph showing 2D TCAD simulations illustrating an impact of embedded, non-overlapping source field plate in accordance with an example embodiment of the invention on small signal gain.

Referring to FIG. 12, a graph 300 of 2D TCAD simulations is shown illustrating an impact of an embedded, non-overlapping source connected field plate in accordance with an example embodiment of the invention on small signal gain. In an example, a curve 302 is shown illustrating the impact of an embedded, non-overlapping source connected field plate in accordance with an example embodiment of the invention on small signal gain at Vds=28V and Ids=100 mA/mm. A curve 304 is shown illustrating the impact of an embedded, overlapping source connected field plate. A curve 306 is shown illustrating the impact of a non-embedded, overlapping source field plate on small signal gain at Vds=28V and Ids=100 mA/mm. In general, the gain may be several decibels (dBs) higher with an embedded source connected field plate, where the bottom edge of the source connected field plate is at the same height as the cap portion of the T-shaped gate electrode. The improvement is generally due to reduced gate to drain capacitance originating from an increased shielding effect of the source connected field plate.

In various embodiments, an embedded source connected field plate may be employed that does not have any overlap on top or under the gate cap. The source connected field plate may be positioned within the gate and drain access region. The bottom edge of the field plate may sit on top of the first passivation layer instead on top of the second passivation layer, typically shown in publications and adopted widely by industries. The low level (closer to the epi surface or substrate) source connected field plate may reduce gate parasitic capacitance thus boosting gain while reducing the peak electric field near the gate drain edge. While the improvement in peak electric field is similar to the case of the overlapping source field plate, the improvement in gain is significant and generally tied to the vertical positioning of the bottom edge of the source connected field plate. The improvement in gain is generally observed both at low and high frequencies for the same device with modified source connected field plate design.

The functions and structures illustrated in the diagrams of FIGS. 1 to 12 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may be also be implemented in one or more of RF analog and/or digital ASICs (application specific integrated circuits) and/or MMICs (monolithic microwave integrated circuits), which includes but is not limited to, power amplifiers, voltage controlled oscillators, phase locked oscillators, frequency dividers, etc. Embodiments of the present invention may be utilized in connection with RF frontend modules in microwave communications systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A device comprising:
a semiconductor die including a plurality of semiconductor layers disposed on an insulating substrate;
a source contact and a drain contact electrically coupled to a channel formed in the semiconductor layers and defining an active area of the device;
a barrier layer formed on a channel layer of said semiconductor die within said active area of the device;
a cap layer formed on said barrier layer of said semiconductor die within said active area of the device;
a first passivation layer formed on a surface of said cap layer of said semiconductor die within said active area of the device;
a T-shaped gate contact disposed within said active area of the device, wherein (i) said T-shaped gate contact is electrically separated from said channel and comprises a column portion and a cap portion, (ii) said column portion extends from a bottom surface of said cap portion, through an opening in said first passivation layer, and contacts said surface of said cap layer of said semiconductor die, and (iii) said bottom surface of said cap portion contacts a surface of said first passivation layer;
a field plate disposed above said first passivation layer within said active area of the device, wherein the entire field plate is laterally separated from a drain edge of said bottom surface of said cap portion of said T-shaped gate contact by a first distance ranging from about 0.1 μm to about 1 μm, a bottom surface of the entire field plate is uniformly separated from said surface of said cap layer by at least said first passivation layer, and the entire field plate is non-overlapping of said cap portion of said T-shaped gate contact; and
a second passivation layer formed on said surface of said first passivation layer, upper surfaces of said cap portion of said T-shaped gate contact, and upper surfaces of said field plate.

2. The device according to claim 1, wherein said device comprises at least one of a gallium nitride (GaN) transistor, a metal oxide semiconductor field effect transistor (MOSFET), and a metal insulator semiconductor high electron mobility transistor (MIS-HEMT).

3. The device according to claim 1, wherein said device comprises a Nitrogen polar (n-polar) or Gallium polar (Ga-polar) device structure.

4. The device according to claim 1, wherein said field plate comprises a source connected field plate.

5. The device according to claim 1, wherein said device comprises a high electron mobility transistor (HEMT) having a source connected field plate.

6. The device according to claim 1, wherein said field plate comprises multiple fingers.

7. The device according to claim 1, wherein:
said first passivation layer comprises an inorganic dielectric layer;
said second passivation layer comprises an inorganic dielectric layer or an organic dielectric layer; and
said field plate is embedded between said first passivation layer and said second passivation layer.

8. The device according to claim 1, wherein said field plate and said cap portion of said T-shaped gate contact have the same thickness.

9. The device according to claim 1, wherein said field plate has a first thickness, said cap portion of said T-shaped gate contact has a second thickness, and the first thickness is smaller than the second thickness.

10. The device according to claim 1, wherein said field plate has a first thickness, said cap portion of said T-shaped gate contact has a second thickness, and the first thickness is greater than the second thickness.

11. The device according to claim 1, wherein:
said cap portion of said T-shaped gate contact is formed on said first passivation layer; and
said field plate is formed on said surface of said first passivation layer.

12. The device according to claim 1, wherein:
said cap portion of said T-shaped gate contact is formed on said first passivation layer; and
a portion or all of said field plate is embedded within a recess in said first passivation layer.

13. The device according to claim 1, wherein:
said cap portion of said T-shaped gate contact is formed on said first passivation layer; and
said field plate is disposed above and the bottom surface of the entire field plate is uniformly separated from said surface of said first passivation layer by a second distance ranging from about 0.05 μm to about 0.5 μm, and is completely embedded in said second passivation layer.

14. The device according to claim 1, wherein:
said cap portion of said T-shaped gate contact is formed on said first passivation layer; and
said field plate is disposed above and the bottom surface of the entire field plate is uniformly separated from said surface of said first passivation layer by a second distance ranging from about 0.05 µm to about 0.5 µm, and is partially embedded in said second passivation layer.

15. The device according to claim 1, wherein:
said field plate is formed on said first passivation layer;
said cap portion of said T-shaped gate contact is separated from said first passivation layer by a portion of said second passivation layer; and
said column portion of said T-shaped gate contact extends through said portion of said second passivation layer and through said first passivation layer.

16. The device according to claim 1, wherein:
said plurality of semiconductor layers include said barrier layer and said channel layer forming a heterojunction;
said barrier layer comprises at least one of an aluminum gallium nitride (AlGaN) epi layer, an indium aluminum nitride (InAlN) epi layer, and an aluminum nitride (AlN) epi layer;
said channel layer comprises a gallium nitride (GaN) epi layer; and
said epi layers are grown on a substrate comprising at least one of silicon, silicon carbide (SiC), Sapphire, and Diamond.

17. A device comprising:
a semiconductor die including a plurality of semiconductor layers disposed on an insulating substrate;
a source contact and a drain contact electrically coupled to a channel formed in the semiconductor layers and defining an active area of the device;
a barrier layer formed on a channel layer of said semiconductor die within said active area of the device;
a cap layer formed on said barrier layer of said semiconductor die within said active area of the device;
a first passivation layer formed on a surface of said cap layer of said semiconductor die within said active area of the device;
a T-shaped gate contact disposed within said active area of the device, wherein (i) said T-shaped gate contact is electrically separated from said channel and comprises a column portion and a cap portion, (ii) said column portion extends from a bottom surface of said cap portion, through an opening in said first passivation layer, and contacts said surface of said cap layer of said semiconductor die, and (iii) said bottom surface of said cap portion contacts a surface of said first passivation layer;
a first source connected field plate formed on said first passivation layer within said active area of the device, wherein the entire first source connected field plate is laterally separated from a drain edge of said bottom surface of said cap portion of said T-shaped gate contact by a distance ranging from about 0.1 µm to about 1 µm, a bottom surface of the entire field plate is uniformly separated from said surface of said cap layer by at least said first passivation layer, and the entire first source connected field plate is non-overlapping of said cap portion of said T-shaped gate contact;
a second passivation layer formed on said surface of said first passivation layer, upper surfaces of said cap portion of said T-shaped gate contact, and upper surfaces of said first source connected field plate; and
a second source connected field plate disposed on said second passivation layer above said first source connected field plate and extending lateral toward said source contact such that said second source connected field plate overlaps said T-shaped gate contact.

18. A device comprising:
a semiconductor die including a plurality of semiconductor layers disposed on an insulating substrate;
a source contact and a drain contact electrically coupled to a channel formed in the semiconductor layers and defining an active area of the device;
a barrier layer formed on a channel layer of said semiconductor die within said active area of the device;
a cap layer formed on said barrier layer of said semiconductor die within said active area of the device;
a first passivation layer formed on a surface of said cap layer of said semiconductor die within said active area of the device;
a T-shaped gate contact disposed within said active area of the device, wherein (i) said T-shaped gate contact is electrically separated from said channel and comprises a column portion and a cap portion, (ii) said column portion extends from a bottom surface of said cap portion, through an opening in said first passivation layer, and contacts said surface of said cap layer of said semiconductor die, and (iii) said cap portion is formed on said first passivation layer;
a second passivation layer covering said first passivation layer and said cap portion of said T-shaped gate contact; and
a source connected field plate adjacent to and laterally separated from said cap portion of said T-shaped gate contact, wherein said source connected field plate has a first portion and a second portion, the first portion overlaps said cap portion of said T-shaped gate contact, the second portion has a bottom edge that is formed within a recess etched in at least one of said first passivation layer and said second passivation layer, the entire second portion is laterally separated from a drain edge of said bottom surface of said cap portion of said T-shaped gate contact by a distance ranging from about 0.1 µm to about 1 µm, and the entire second portion is non-overlapping of said cap portion of said T-shaped gate contact.

19. The device according to claim 18, wherein a vertical position of said bottom edge of said second portion of said source connected field plate is lower than said bottom surface of said cap portion of said T shaped gate contact.

20. The device according to claim 18, wherein said bottom edge of said second portion of said source connected field plate and said bottom surface of said cap portion of said T shaped gate contact are at the same level.

* * * * *